United States Patent
Kobayashi

(10) Patent No.: US 8,184,493 B2
(45) Date of Patent: May 22, 2012

(54) SEMICONDUCTOR MEMORY DEVICE AND SYSTEM

(75) Inventor: Hiroyuki Kobayashi, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 212 days.

(21) Appl. No.: 12/683,198

(22) Filed: Jan. 6, 2010

(65) Prior Publication Data

US 2010/0110810 A1    May 6, 2010

Related U.S. Application Data

(63) Continuation of application No. PCT/JP2007/063856, filed on Jul. 11, 2007.

(51) Int. Cl.
*G11C 29/00* (2006.01)

(52) U.S. Cl. ......... 365/200; 365/222; 365/236; 365/239

(58) Field of Classification Search .................. 365/239
See application file for complete search history.

(56) References Cited

U.S. PATENT DOCUMENTS

| | | | | |
|---|---|---|---|---|
| 6,185,137 B1 * | 2/2001 | Sato et al. | ...... | 365/200 |
| 6,590,815 B2 * | 7/2003 | Mine | ...... | 365/200 |
| 6,633,504 B1 | 10/2003 | Lee et al. | | |
| 6,731,560 B2 * | 5/2004 | Yoon et al. | ...... | 365/222 |
| 2002/0003732 A1 | 1/2002 | Ohtani et al. | | |
| 2002/0080657 A1 | 6/2002 | Mine | | |
| 2003/0028712 A1 | 2/2003 | Horiguchi et al. | | |
| 2007/0002656 A1 * | 1/2007 | An | ...... | 365/222 |

FOREIGN PATENT DOCUMENTS

| | | |
|---|---|---|
| JP | 09-293394 A | 11/1997 |
| JP | 2000-357398 A | 12/2000 |
| JP | 2002-25291 A | 1/2002 |
| JP | 2002-124096 A | 4/2002 |
| JP | 2003-45178 A | 2/2003 |
| JP | 2003-297092 A | 10/2003 |

* cited by examiner

*Primary Examiner* — Tan T. Nguyen
(74) *Attorney, Agent, or Firm* — Arent Fox LLP

(57) ABSTRACT

A semiconductor memory device includes a memory cell array including primary word lines and one or more redundant word lines, a timing signal generating circuit configured to generate a refresh timing signal comprised of a series of pulses arranged at constant intervals, and a refresh-target selecting circuit configured to successively select all the primary word lines and all the one or more redundant word lines one by one in response to the respective pulses of the refresh timing signal, wherein a refresh operation is performed with respect to the word lines that are successively selected by the refresh-target selecting circuit.

16 Claims, 10 Drawing Sheets

SEMICONDUCTOR MEMORY DEVICE AND SYSTEM

CROSS-REFERENCE TO RELATED APPLICATIONS

This is a continuation of International Application No. PCT/JP2007/063856, filed on Jul. 11, 2007, the entire contents of which are hereby incorporated by reference.

FIELD

The disclosures herein generally relate to semiconductor memory devices, and particularly relate to a semiconductor memory device having a redundancy function.

BACKGROUND

Semiconductor memory devices are provided with a redundancy function to replace a defective memory cell with a redundancy memory cell that is a backup memory cell. Memory cell operations are tested at the time of shipment of a semiconductor memory device. Upon finding a defective memory cell, the address of this defective memory cells is recorded in a fuse circuit or the like. An address to be accessed that is applied from an external device may match the address of the defective memory cell that is recorded in the fuse circuit. Upon such an event, an access location is switched to a redundant memory cell, thereby causing the redundant memory cell, rather than the defective memory cell, to be accessed. With this arrangement, the address of the defective memory cell is made usable. In general, a redundancy replacement operation is performed on a word-line-by-word-line basis or a column-line-by-column-line basis.

The use of a redundant memory cell is avoided if this redundant memory cell is defective. To this end, a test to check the operations of a semiconductor memory device preferably includes not only a test to check primary memory cell operations but also a test to check redundant memory cell operations. With the configuration that performs a redundancy replacement on a word-line-by-word-line basis, for example, all the primary word lines and all the redundant word lines are tested for operations. In general, every access is performed with respect to a primary word line if no recording has been made to the fuse circuit. In order to test redundant word line operations, thus, a test mode that specifies a redundant line test is activated. Access to a desired redundant word line is then performed by specifying an address assigned to this redundant word line. Performing of a redundancy operation in such a forcible manner is referred to as "forced redundancy"

DRAM (Dynamic Random Access Memory) performs a refresh operation with respect to each memory cell at constant intervals in order to retain memory cell data. A refresh command may be applied from an external source to perform a refresh operation. Alternatively, a refresh timing and address are generated inside the semiconductor memory device by an internal refresh mechanism to perform a refresh operation. A refresh operation initiated by the internal refresh mechanism is also used during the test that checks memory cell operations such as a disturb test.

When the forced redundancy described above is activated, however, a primary word line having an address assigned to a redundant word line may not be accessed. A refresh operation initiated by the internal refresh mechanism is thus not performed with respect to this primary word line. When the forced redundancy is not activated, a redundant word line may not be accessed. A refresh operation initiated by the internal refresh mechanism is thus not performed with respect to this redundant word line. In this manner, the activation of forced redundancy leads to a situation in which the performance of a primary word line is not properly tested, and the deactivation of forced redundancy leads to a situation in which the performance of a redundant word line is not properly tested. Consequently, a test to check the operation of redundant word lines and a test to check the operation of primary word lines may need to be performed one by one.

Patent Document 1 discloses a synchronous DRAM that refreshes main cells and backup cells successively at the time of auto refresh operation in a test mode. Patent Document 2 discloses a DRAM that is capable of reducing a test time by refreshing normal cells and redundant cells at the same time. Patent Document 3 discloses a semiconductor memory provided with an access mechanism to access all the real cells and redundant cells in the same address space at the time of test.

[Patent Document 1] Japanese Laid-open Patent Publication No. 2000-357398

[Patent Document 2] Japanese Laid-open Patent Publication No. 2003-297092

[Patent Document 3] Japanese Laid-open Patent Publication No. 09-293394

SUMMARY

According to an aspect of the embodiment, a semiconductor memory device includes a memory cell array including primary word lines and one or more redundant word lines, a timing signal generating circuit configured to generate a refresh timing signal comprised of a series of pulses arranged at constant intervals, and a refresh-target selecting circuit configured to successively select all the primary word lines and all the one or more redundant word lines one by one in response to the respective pulses of the refresh timing signal, wherein a refresh operation is performed with respect to the word lines that are successively selected by the refresh-target selecting circuit.

In a system including a CPU and a memory, the memory includes a memory cell array including primary word lines and one or more redundant word lines, a timing signal generating circuit configured to generate a refresh timing signal comprised of a series of pulses arranged at constant intervals, and a refresh-target selecting circuit configured to successively select all the primary word lines and all the one or more redundant word lines one by one in response to the respective pulses of the refresh timing signal, wherein the memory is configured to perform a refresh operation with respect to the word lines that are successively selected by the refresh-target selecting circuit.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described with reference to the accompanying drawings.

Figure 1:
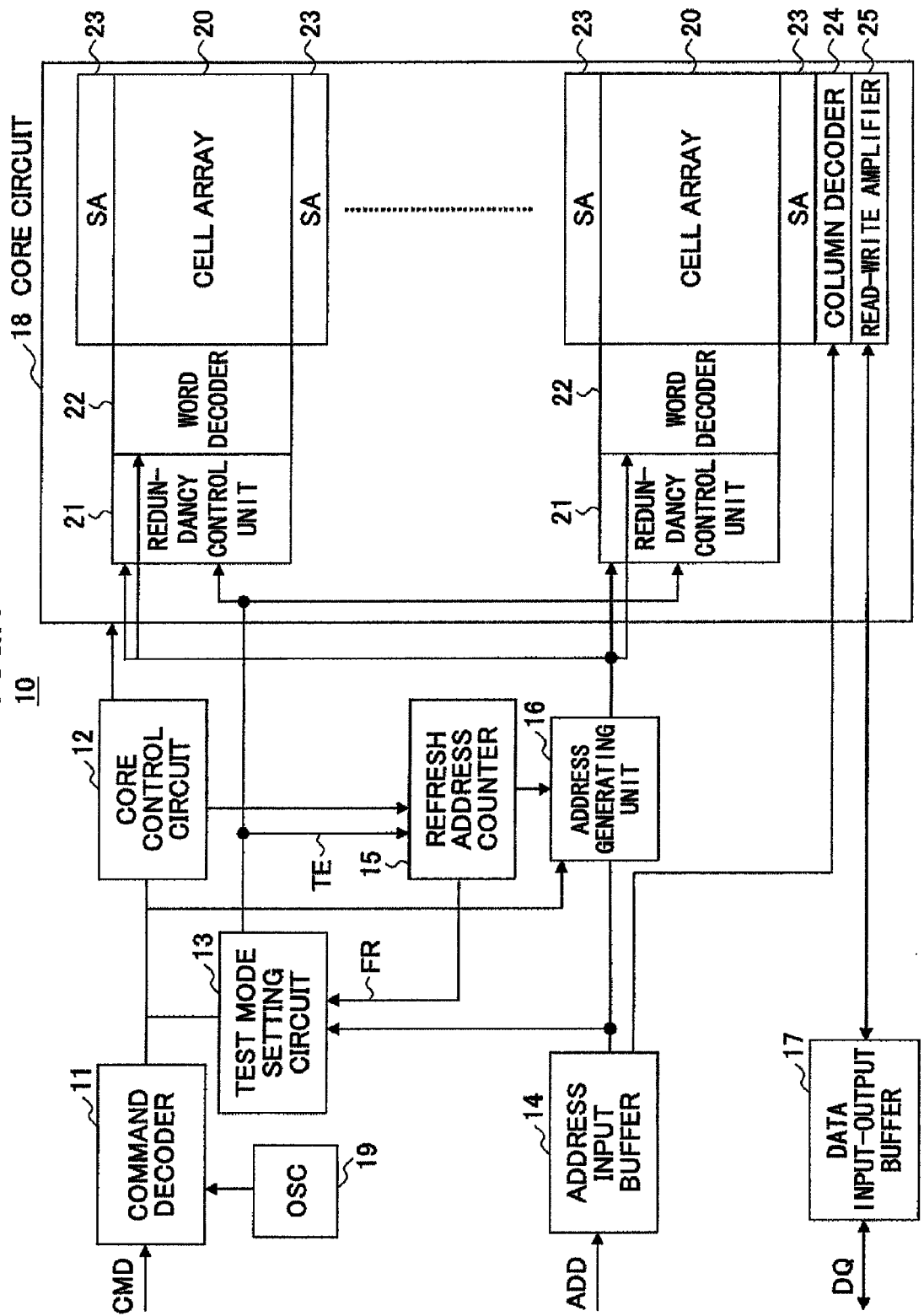
FIG. 1 is a drawing illustrating an example of the configuration of a semiconductor memory device.

FIG. 1 is a drawing illustrating an example of the configuration of a semiconductor memory device. A semiconductor memory device 10 of FIG. 1 includes a command decoder 11, a core control circuit 12, a test mode setting circuit 13, an address input buffer 14, a refresh address counter 15, an address generating unit 16, a data input-output buffer 17, a core circuit 18, and an oscillator (OS) 19. The core circuit 18 includes a plurality of cell arrays 20. In the core circuit 18, further, a redundancy control unit 21, a word decoder 22, and a sense amplifier (SA) 23 are provided for each cell array 20. Further, a column decoder 24 and read-write amplifier 25 are provided to be shared by the plurality of cell arrays 20.

The command decoder 11 receives control signals indicating commands from an external device outside the semiconductor memory device 10. The command decoder 11 decodes these control signals to generate various control signals based on the decoded results. These control signals are supplied to relevant circuit parts such as the core control circuit 12, the test mode setting circuit 13, the address generating unit 16, and so on. For example, the command decoder 11 supplies to the test mode setting circuit 13 a signal requesting the loading of operation test settings into a register in response to a mode register setting command.

The core control circuit 12 generates various timing signals corresponding to operations (e.g., data read operation, data write operation, and the like) specified by the control signals based on a clock signal and the control signals from the command decoder 11. The generated timing signals are supplied to the core circuit 18 and the refresh address counter 15, for example. Each circuit part operates in accordance with the timings specified by these timing signals.

The test mode setting circuit 13 loads part of address signals supplied from the address input buffer 14 as register settings in response to an instruction that is supplied from the command decoder 11 responding to a mode register setting command. Namely, part of address signals is stored in an internal mode register as setting values indicative of the specifications of an operation test. The test mode setting circuit 13 further sets a forced redundancy indicating signal to an asserted state in response to a forced redundancy request signal FR supplied from the refresh address counter 15 or in response to a setting that is supplied from an external source as will be described later. Various control signals regarding an operation test including the above-noted forced redundancy indicating signal are supplied from the test mode setting circuit 13 to the core circuit 18.

The address input buffer 14 receives address signals indicative of a row address and address signals indicative of a column address from an external source outside the chip of the semiconductor memory device 10. The received row address is supplied to the address generating unit 16, and the received column address is supplied to the column decoder 24. Further, the address signals are supplied to the test mode setting circuit 13.

The refresh address counter 15 operates under the control of the core control circuit 12 to generate a refresh address that is a target address for which a refresh operation is to be performed. The generated refresh address is supplied to the address generating unit 16. Based on the row address from the address input buffer 14 and the refresh address from the refresh address counter 15, the address generating unit 16 supplies a row address indicative of a word line to be accessed in a read operation, a write operation, and a refresh operation.

In each cell array 20 of the core circuit 18, a plurality of memory cells are arranged in a matrix form extending in a row direction and a column direction to constitute a cell array. Each memory cell stores data. Each cell array 20 includes a plurality of word lines corresponding to a plurality of row addresses, and a plurality of memory cells are coupled to each word line. A plurality of bits lines are arranged in a direction in which column addresses are arranged, and sense amplifiers are coupled to the respective bit lines. The plurality of word lines includes primary word lines and redundant word lines.

In the cell array 20 that is specified as the one to be activated by part of the row address (i.e., block address), the word decoder 22 decodes the row address supplied from the address generating unit 16 to selectively activate a word line specified by the row address. The column decoder 24 decodes the column address supplied from the address input buffer 14, and selectively activates a column selecting line specified by the column address.

Data stored in memory cells connected to the activated word line are read to the bit lines and amplified by the sense amplifier 23. In the case of a read operation, the data amplified by the sense amplifier 23 is subjected to selection by the activated column selecting line, and the selected data is output to outside the semiconductor memory device 10 via the read-write amplifier 25 and the data input-output buffer 17. In the case of a write operation, write data is supplied from an external source outside the semiconductor memory device 10 via the data input-output buffer 17 and the read-write amplifier 25, and is written to the sense amplifier 23 at the column address selected by the activated column selecting line in the cell array 20 that is activated. This write data and the data that were read from memory cells and ought to be restored are written to the memory cells connected to the activated word line.

The oscillator 19 supplies an oscillator oscillating signal to the command decoder 11. The command decoder 11 supplies the clock signal and control signals responsive to the oscillating signal to the core control circuit 12. Based on the clock signal and control signals, the core control circuit 12 operates as a timing signal generating circuit to generate a refresh timing signal comprised of a series of pulses arranged at constant intervals. Each pulse of this refresh timing signal is supplied to the refresh address counter 15, which generates a refresh address in response to each pulse.

In the embodiment illustrated in FIG. 1, the refresh address counter 15 is configured to successively select each and every one of the primary word lines and redundant word lines in response to the pulses of the refresh timing signal. The core circuit 18 performs refresh operations with respect to word lines that are successively selected by the refresh address counter 15. In such an operation, the refresh address counter 15 is configured to be switchable between a first mode and a second mode to successively select, in the first mode, word lines one by one that are equal in number to the primary word lines, and to successively select, in the second mode, all the primary word lines and all the redundant word lines one by one. Switching is controlled by a test signal TE supplied from the test mode setting circuit 13.

The second mode is used when all the primary word lines and all the redundant word lines are to be refreshed at the time of an operation test or the like. The first mode is used when the it suffices to refresh word lines as many as the number of the primary word lines, i.e., it suffices to refresh only the accessible address space, such as when defective addresses detected by an operation test have already been set as redundancy addresses (i.e., addresses for which redundancy operations are performed).

Figure 2:
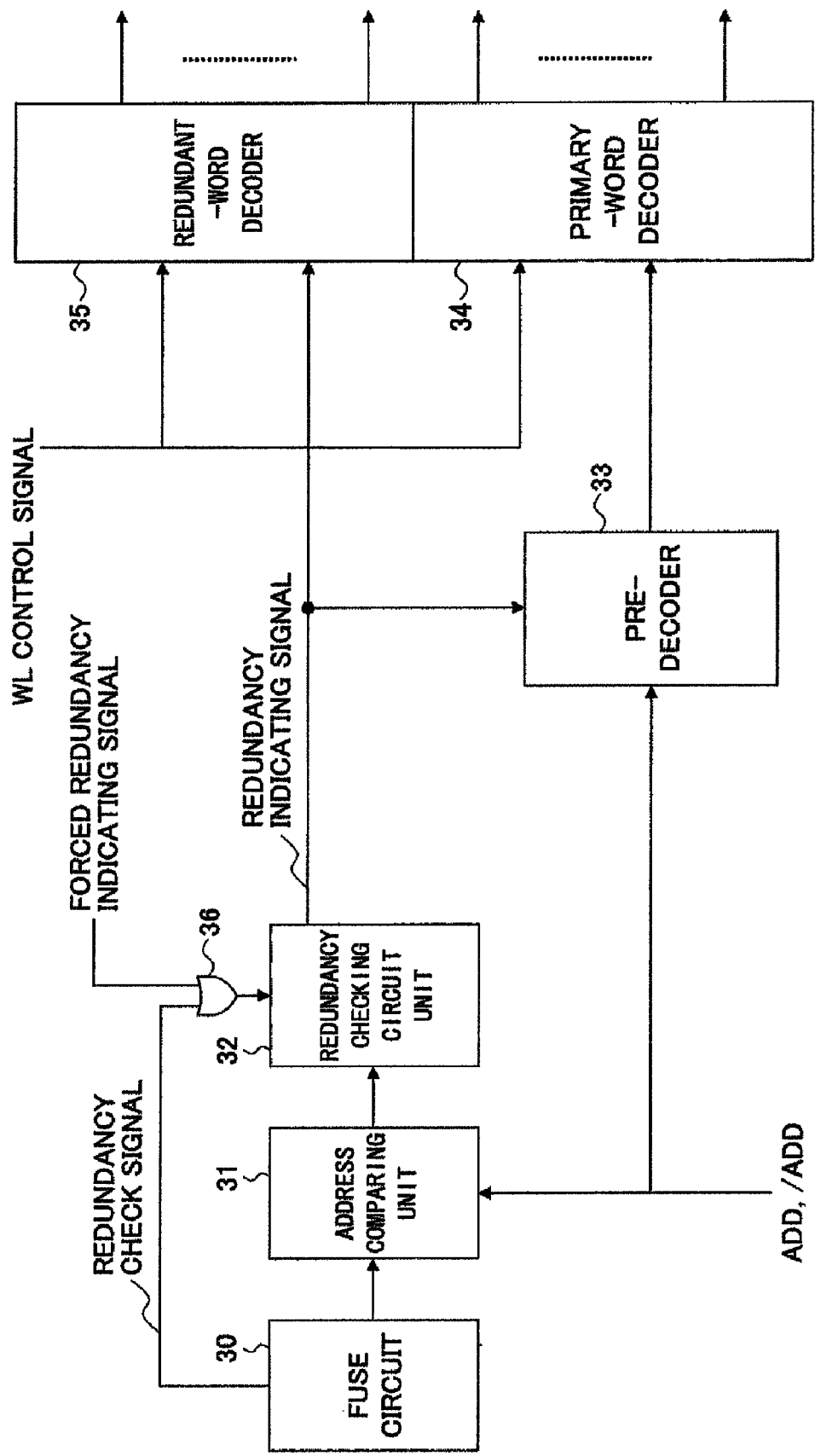
FIG. 2 is a drawing for explaining a configuration for redundancy control in the semiconductor memory device.

FIG. 2 is a drawing for explaining a configuration for redundancy control in the semiconductor memory device 10. The configuration illustrated in FIG. 2 includes a fuse circuit 30, an address comparing unit 31, a redundancy checking circuit unit 32, a pre-decoder 33, a primary-word decoder 34, and a redundant-word decoder 35. The fuse circuit 30, the address comparing unit 31, and the redundancy checking circuit unit 32 correspond to the redundancy control unit 21 illustrated in FIG. 1, and the pre-decoder 33, the primary-word decoder 34, and the redundant-word decoder 35 correspond to the word decoder 22 illustrated in FIG. 1.

The fuse circuit 30 includes a plurality of fuses. Fuses are selectively cut through exposure to laser light or the like to specify addresses for which redundancy replacement is performed. Namely, a defective memory cell may be found at a row address X as a result of an operation test of the semiconductor memory device 10. Upon such an event, fuses are selectively cut in the fuse circuit 30, such that the output signals of the fuse circuit 30 responsive to the cut or intact states of the fuses indicate the row address X as a redundancy address.

The fuse circuit 30 is also configured to output a redundancy check signal to indicate whether a redundancy address has already been set such that the output signals of the fuse circuit 30 specify a valid redundancy address. The state of the redundancy check signal is checked to determine whether the output signals of the fuse circuit 30 are to be used as a redundancy address.

The address comparing unit 31 compares a redundancy address indicated by the output signals of the fuse circuit 30 with an access address indicated by address signals ADD supplied from the address generating unit 16. For the sake of convenience of processing, the address signals ADD and the inverted signals /ADD are supplied to the address comparing unit 31. The address comparing unit 31 outputs a signal indicative of bitwise match or mismatch between the redundancy address and the access address.

The redundancy checking circuit unit 32 asserts a redundancy indicating signal in response to an event that the signal indicative of bitwise match or mismatch indicates matches for all the bits when the redundancy check signal is HIGH. The assertion of the redundancy indicating signal causes the outputs of the pre-decoder 33 for pre-decoding the address signals ADD to be blocked. Since no pre-decode signal is output from the pre-decoder 33, the primary-word decoder 34 does not select a primary word line.

In response to the assertion of the redundancy indicating signal, further, the redundant-word decoder 35 selectively activates a redundant word line corresponding to the fuse circuit 30. Although not illustrated, plural sets each comprised of the fuse circuit 30, the address comparing unit 31, and the redundancy checking circuit unit 32 may be provided in one-to-one correspondence to the plural redundant word lines. When an access address specified by an external source matches a redundancy address indicated by a given fuse circuit 30, the redundant word line corresponding to this fuse circuit 30 will be selected.

At the time the semiconductor memory device 10 is about to be tested for operations, defective addresses are yet unknown. No redundancy address is set in the fuse circuit 30. In this state, the output signals of the fuse circuit 30 are invalid, and the redundancy check signal is set to LOW indicating the invalid state. In the operation test of the semiconductor memory device 10, however, there may be a need to test the redundant memory cells by allowing the redundant-word decoder 35 to select the redundant word lines. In the operation test mode of the semiconductor memory device 10, the test mode setting circuit 13 (see FIG. 1) is configured such that the forced redundancy indicating signal output from the test mode setting circuit 13 is set to HIGH (i.e., asserted state) according to need. When the forced redundancy indicating signal is set to HIGH (i.e., asserted state), the output of an OR gate 36 for performing a logical sum between the forced redundancy indicating signal and the redundancy check signal becomes HIGH. The redundancy checking circuit unit 32 thus operates in the same manner as in the case of the redundancy check signal being HIGH. Namely, the redundancy checking circuit unit 32 asserts a redundancy indicating signal in response to an event that the signal indicative of bitwise match or mismatch supplied from the address comparing unit 31 indicates matches for all the bits. The configuration illustrated in FIG. 2 is only an example. The configuration that combines the redundancy check signal and the forced redundancy indicating signal to activate a redundancy operation may be embedded in the address comparing unit 31, for example.

During a routine operation of the semiconductor memory device 10, the forced redundancy indicating signal is in a negated state. The redundancy check signal is HIGH to indicate a valid state if a redundancy address has properly been set in the fuse circuit 30. In such a case, the redundancy control unit 21 selects either a redundant word line or a primary word line corresponding to the address of the location to be accessed in response to match or mismatch between the access address and the redundancy address (i.e., the address recorded in the fuse circuit 30). With the semiconductor memory device 10 being in the test operation state, the output signals of the fuse circuit 30 are invalid, and the redundancy check signal is set to LOW indicating an invalid state. In such a case, the redundancy control unit 21 selects only a primary word line specified by the address of the location to be accessed if the forced redundancy indicating signal is in a negated state. In the case of the forced redundancy indicating signal being in an asserted state, the redundancy control unit 21 selects a redundant word line corresponding to the address of the location to be accessed if the address of the location to be accessed indicates an address of a redundant word line, and otherwise selects a primary word line corresponding to the address of the location to be accessed.

Figure 3:
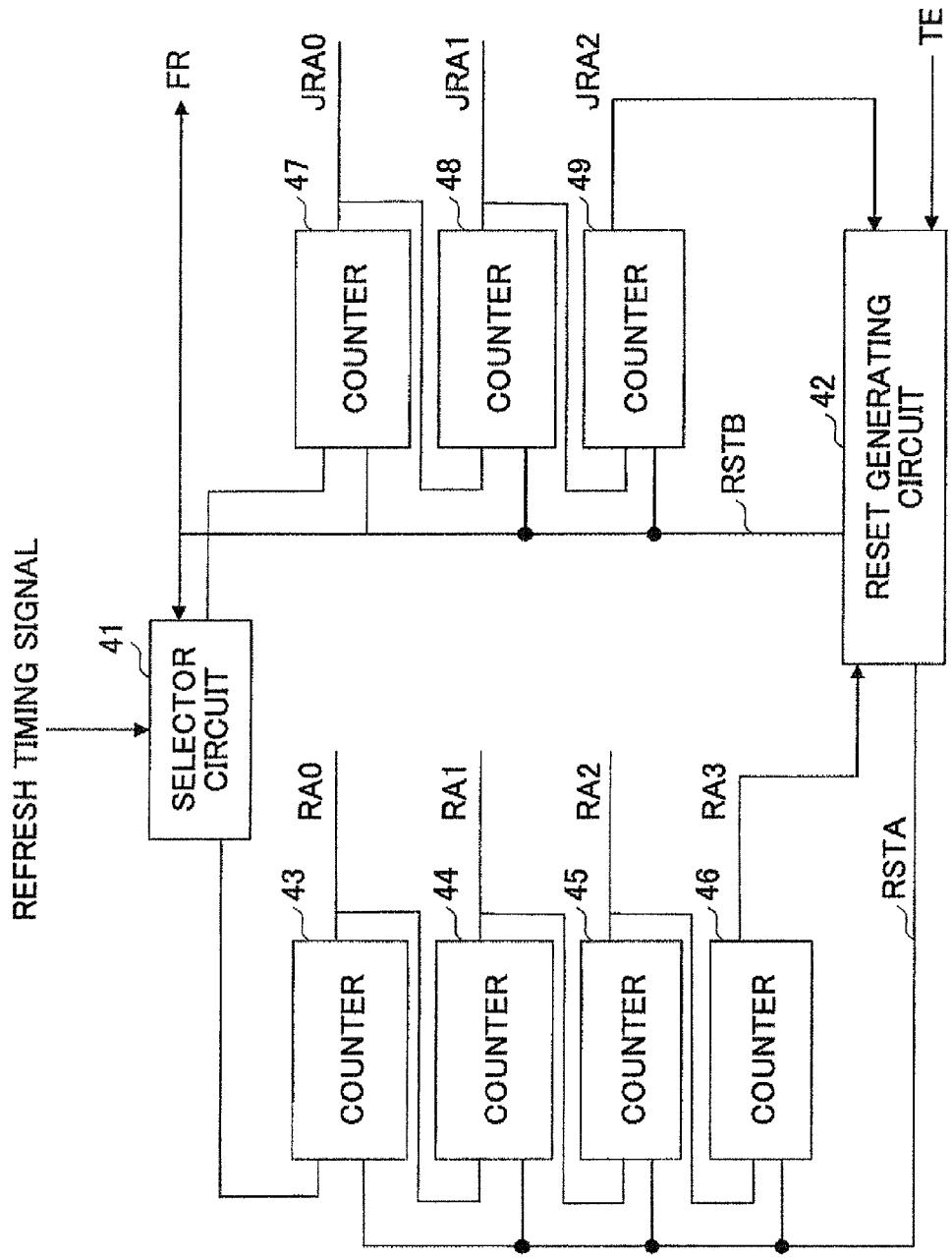
FIG. 3 is a drawing showing an example of the configuration of a refresh address counter.

The redundant word line corresponding to the address of the location to be accessed is a redundant word line corresponding to a set comprised of the fuse circuit 30, the address comparing unit 31, and the redundancy checking circuit unit 32 for which the output of the address comparing unit 31 responsive to the supplied address indicates matches for all the bits. In the default state in which no redundancy address is set in the fuse circuit 30, the address "000" that is a word line address comprised of 3 bits may be supplied as ADD to the address comparing unit 31. In response, the output of the address comparing unit 31 may indicate that all the bits match. In such a case, the address "000" is the address corresponding to the redundant word line corresponding to the above-noted fuse circuit 30. The value of an address corresponding to a given redundant word line depends on the state of initial settings of a set comprised of the fuse circuit 30, the address comparing unit 31, and the redundancy checking circuit unit 32. For example, initial settings may be made such that address values "000", "001", and "002" are assigned to three redundant word lines, respectively. In this case, the address values "000", "001", and "002" may be successively selected as the addresses of the locations to be accessed, thereby successively selecting these three redundant word lines. FIG. 3 is a drawing illustrating an example of the configuration of the refresh address counter 15. The refresh address counter 15 illustrated in FIG. 3 is directed to a case in which a primary word line address is comprised of 3 bits, and a redundant word line address is comprised of 2 bits. The refresh address counter 15 includes a selector circuit 41, a reset generating circuit 42, and counters 43 through 49. The numbers of bits of a primary word line address and a redundant word line address are not limited to this example. Each of the counters 43 through 49 may be a toggle circuit whose output is inverted in response to a falling edge of an input signal.

The counters 43 through 46 constitute a first counter circuit that generates word-line addresses equal in number to the number of the primary word lines. The counters 47 through 49 constitute a second counter circuit that generates word-line addresses equal in number to the number of the redundant word lines. The refresh timing signal supplied from the core control circuit 12 is supplied to the selector circuit 41. The selector circuit 41 supplies the refresh timing signal to either the first counter circuit or the second counter circuit depending on a signal RSTB supplied from the reset generating circuit 42.

The reset generating circuit 42 operates differently, depending on whether a test signal TE supplied from the test mode setting circuit 13 (see FIG. 1) is in an asserted state or in a negated state. In the following, a description will be first given of the case in which the test signal TE is in the asserted state.

The reset generating circuit 42 sets a signal RSTA to a negated state and the signal RSTB to an asserted state. In response to the negated state of the signal RSTA, the first counter circuit (i.e., the counters 43 through 46) is placed in an operable state (i.e., enable state). In response to the asserted state of the signal RSTB, further, the second counter circuit (i.e., the counters 47 through 49) is placed in a reset state, so that address signals JRA0 through JRA1 and a timing signal JRA2 are fixed.

The selector circuit 41 supplies the refresh timing signal only to the first counter circuit (i.e., counters 43 through 46) in the case of the signal RSTB being in the asserted state. The first counter circuit counts the pulses of the refresh timing signal, thereby incrementing the address indicated by address signals RA0 through RA2 one by one. The address signals RA0 through RA2 are supplied as a refresh address to the address generating unit 16.

The counter 46 counts up in response to a pulse of the refresh timing signal that occurs immediately after the address indicated by the address signals RA0 through RA2 assumes a maximum value, thereby causing a timing signal RA3 to be HIGH. In the case of the test signal TE being in the asserted state, the reset generating circuit 42 responds to the HIGH state of the timing signal RA3 by setting the signal RSTA to an asserted state and the signal RSTB to a negated state. In response, the first counter circuit is placed in a reset state, and the second counter circuit is placed in an operable state (i.e., enable state).

The selector circuit 41 supplies the refresh timing signal only to the second counter circuit (i.e., counters 47 through 49) in the case of the signal RSTB being in the negated state. The second counter circuit counts the pulses of the refresh timing signal, thereby incrementing the address indicated by the address signals JRA0 through JRA1 one by one. The address signals JRA0 through JRA1 are supplied as a refresh address to the address generating unit 16.

The counter 49 counts up in response to a pulse of the refresh timing signal that occurs immediately after the address indicated by the address signals JRA0 through JRA1 assumes a maximum value, thereby causing a timing signal JRA2 to be HIGH. The reset generating circuit 42 responds to the HIGH state of the timing signal JRA2 by setting the signal RSTA to a negated state and the signal RSTB to an asserted state. In response, the first counter circuit is placed in an operable state, and the second counter circuit is placed in a reset state. Thereafter, the above-noted operations are repeated.

In the case of the test signal TE being in the negated state, the reset generating circuit 42 fixes the signal RSTB to an asserted state irrespective of whether the timing signal RA3 is HIGH or LOW. Further, the reset generating circuit 42 responds to the HIGH state of the timing signal RA3 by setting the signal RSTA temporarily to an asserted state to reset the first counter circuit, followed by returning the signal RSTA to a negated state. With this arrangement, only the first counter circuit operates in repetitious fashion, thereby repeating an operation that successively generates word-line addresses ranging from zero to a maximum value that are equal in number to the number of the primary word lines.

The signal RSTB is supplied as the forced redundancy request signal FR to the test mode setting circuit 13 (see FIG. 1). In this example, the positive logic and the negative logic are swapped, so that the signal RSTB in an asserted sate is supplied as the forced redundancy request signal FR in a negated state to the test mode setting circuit 13, and the signal RSTB in a negated sate is supplied as the forced redundancy request signal FR in an asserted state to the test mode setting circuit 13. In response to the asserted state of the forced redundancy request signal FR, the test mode setting circuit 13 sets the forced redundancy indicating signal (see FIG. 2) to an asserted state. In response to the negated state of the forced redundancy request signal FR, the test mode setting circuit 13 sets the forced redundancy indicating signal to a negated state.

In the case in which the signal RSTB is in an asserted state, thus, the first counter circuit operates to successively generate word-line addresses ranging from zero to a maximum value that are equal in number to the number of the primary word lines, without performing a forced redundancy. In the case in which the signal RSTB is in a negated state, the second counter circuit operates to successively generate word-line addresses ranging from zero to a maximum value that are equal in number to the number of the redundant word lines, with a forced redundancy being performed. With the test signal TE being in a negated state, only the first counter circuit operates. With the test signal TE being in an asserted state, the second counter circuit operates in succession after the first counter circuit operates.

Figure 4:
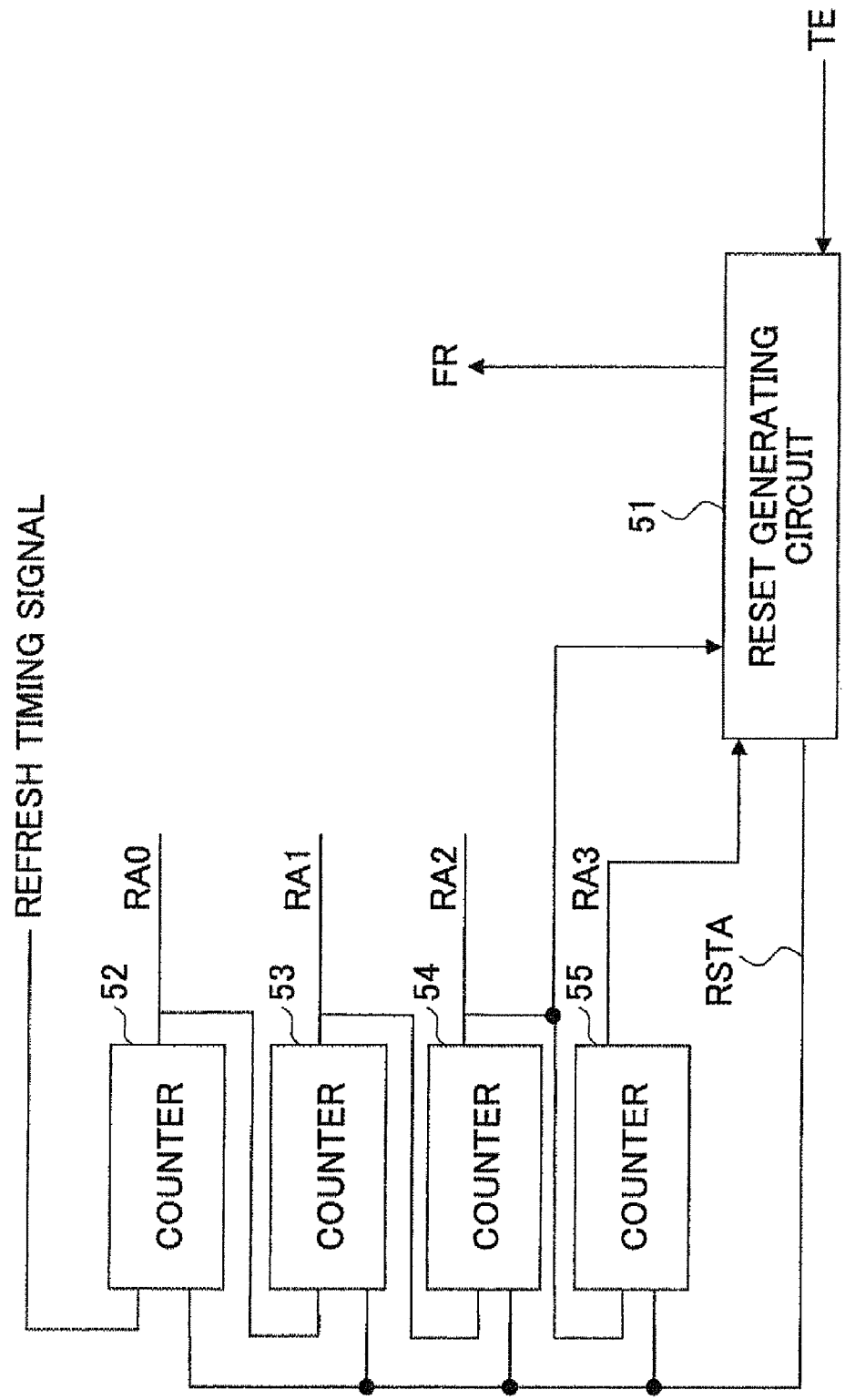
FIG. 4 is a drawing showing another example of the configuration of a refresh address counter.

FIG. 4 is a drawing illustrating another example of the configuration of the refresh address counter 15. The refresh address counter 15 illustrated in FIG. 4 is directed to a case in which a primary word line address is comprised of 3 bits, and a redundant word line address is comprised of 2 bits. The refresh address counter 15 includes a reset generating circuit 51 and counters 52 through 55. The numbers of bits of a primary word line address and a redundant word line address are not limited to this example. Each of the counters 52 through 55 may be a toggle circuit whose output is inverted in response to a falling edge of an input signal.

The counters 52 through 55 are configured to be switchable between an operation that generates word-line addresses equal in number to the number of the primary word lines and an operation that generates word-line addresses equal in number to the number of the redundant word lines. The refresh timing signal supplied from the core control circuit 12 is supplied to the counters 52 through 55

The reset generating circuit 51 operates differently, depending on whether a test signal TE supplied from the test mode setting circuit 13 (see FIG. 1) is in an asserted state or in a negated state. In the following, a description will be first given of the case in which the test signal TE is in the asserted state.

The reset generating circuit 51 sets both the signal RSTA and the forced redundancy request signal FR in a negated state. In response to the negated state of the signal RSTA, the counter circuit (i.e., the counters 52 through 55) is placed in an operable state (i.e., enable state).

The counter circuit counts the pulses of the refresh timing signal, thereby incrementing the address indicated by address signals RA0 through RA2 one by one. The address signals RA0 through RA2 are supplied as a refresh address to the address generating unit 16. The output RA2 of the counter 54 is input into the reset generating circuit 51. This output RA2 of the counter 54 is ignored when the forced redundancy request signal FR is in a negated state.

The counter 55 counts up in response to a pulse of the refresh timing signal that occurs immediately after the address indicated by the address signals RA0 through RA2 assumes a maximum value, thereby causing a timing signal RA3 to be HIGH. In the case of the test signal TE being in the asserted state, the reset generating circuit 51 responds to the HIGH state of the timing signal RA3 by changing the forced redundancy request signal FR to an asserted state and also setting the signal RSTA temporarily to an asserted state. The temporarily asserted state of the signal RSTA serves to reset the counter circuit. The counter circuit is then placed in an operable state (i.e., enable state) when the signal RSTA returns to a negated state.

Thereafter, the counter circuit counts the pulses of the refresh timing signal, thereby incrementing the address indicated by address signals RA0 through RA1 one by one. The address signals RA0 through RA1 are supplied as a refresh address to the address generating unit 16.

The counter 54 counts up in response to a pulse of the refresh timing signal that occurs immediately after the address indicated by the address signals RA0 through RA1 assumes a maximum value, thereby causing the timing signal RA2 to be HIGH. In the case of the forced redundancy request signal FR being in the asserted state, the reset generating circuit 51 responds to the HIGH state of the timing signal RA2 by changing the forced redundancy request signal FR to a negated state and also setting the signal RSTA temporarily to an asserted state. The temporarily asserted state of the signal RSTA serves to reset the counter circuit. The counter circuit is then placed in an operable state (i.e., enable state) when the signal RSTA returns to a negated state. Thereafter, the above-noted operations are repeated.

In the case of the test signal TE being in the negated state, the reset generating circuit 51 fixes the forced redundancy request signal FR to a negated state irrespective of whether the timing signals RA2 and RA3 are HIGH or LOW. Further, the reset generating circuit 51 responds to the HIGH state of the timing signal RA3 by setting the signal RSTA temporarily to an asserted state to reset the counter circuit (i.e., counters 52 through 55), followed by returning the signal RSTA to a negated state. With this arrangement, an operation that successively generates word-line addresses ranging from zero to a maximum value that are equal in number to the number of the primary word lines is repeated.

In response to the asserted state of the forced redundancy request signal FR, the test mode setting circuit 13 (see FIG. 1) sets the forced redundancy indicating signal (see FIG. 2) to an asserted state. In response to the negated state of the forced redundancy request signal FR, the test mode setting circuit 13 sets the forced redundancy indicating signal to a negated state.

In the case in which the forced redundancy request signal FR is in a negated state, thus, the counter circuit operates to successively generate word-line addresses ranging from zero to a maximum value that are equal in number to the number of the primary word lines, without performing a forced redundancy. In the case in which the forced redundancy request signal FR is in an asserted state, the counter circuit operates to successively generate word-line addresses ranging from zero to a maximum value that are equal in number to the number of the redundant word lines, with a forced redundancy being performed. In the case of the test signal TE being in a negated state, the counter circuit operation with the forced redundancy request signal FR set to a negated state is only performed. In the case of the test signal TE being in an asserted state, the counter circuit operation with the forced redundancy request signal FR set to a negated state is performed, followed by the counter circuit operation with the forced redundancy request signal FR set to an asserted state.

Figure 5:
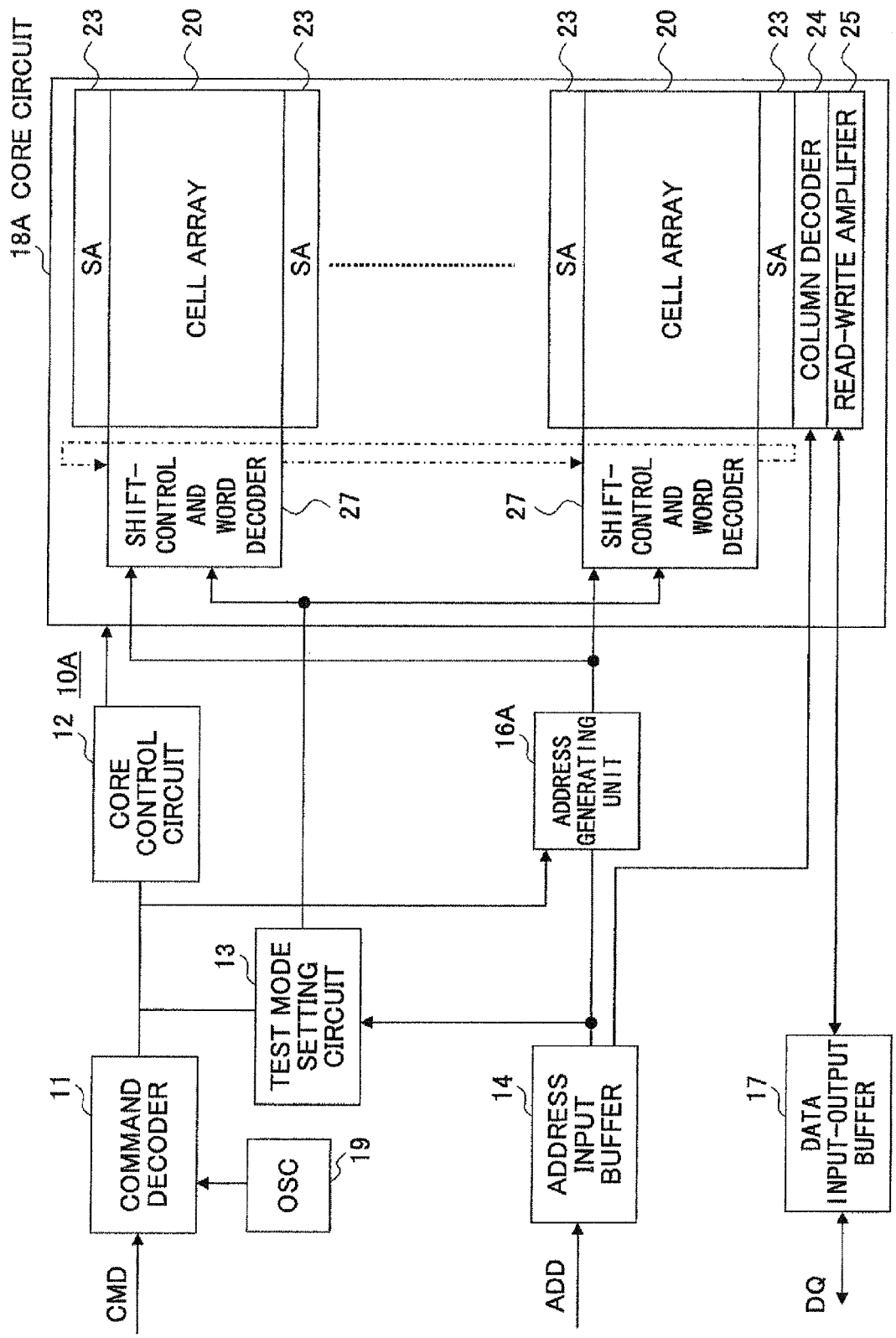
FIG. 5 is a drawing illustrating another example of the configuration of the semiconductor memory device.

FIG. 5 is a drawing illustrating another example of the configuration of the semiconductor memory device. In FIG. 5, the same elements as those of FIG. 1 are referred to by the same numerals, and a description thereof will be omitted.

A semiconductor memory device 10A of FIG. 5 includes the command decoder 11, the core control circuit 12, the test mode setting circuit 13, the address input buffer 14, an address generating unit 16A, the data input-output buffer 17, a core circuit 18A, and the oscillator (OS) 19. The core circuit 18A includes a plurality of cell arrays 20. In the core circuit 18A, further, the sense amplifier (SA) 23 and a shift-control and word decoder 27 are provided for each cell array 20. Further, the column decoder 24 and read-write amplifier 25 are provided to be shared by the plurality of cell arrays 20.

In the semiconductor memory device 10A of FIG. 5, the refresh address counter 15 of FIG. 1 is removed, and the function to specify a word line to be refreshed is embedded in the shift-control and word decoder 27. The address generating unit 16A operates under the control of the command decoder 11 to supply a row address indicative of a word line to be accessed in a read operation and a write operation to the core circuit 18A based on the row address from the address input buffer 14.

Figure 6:
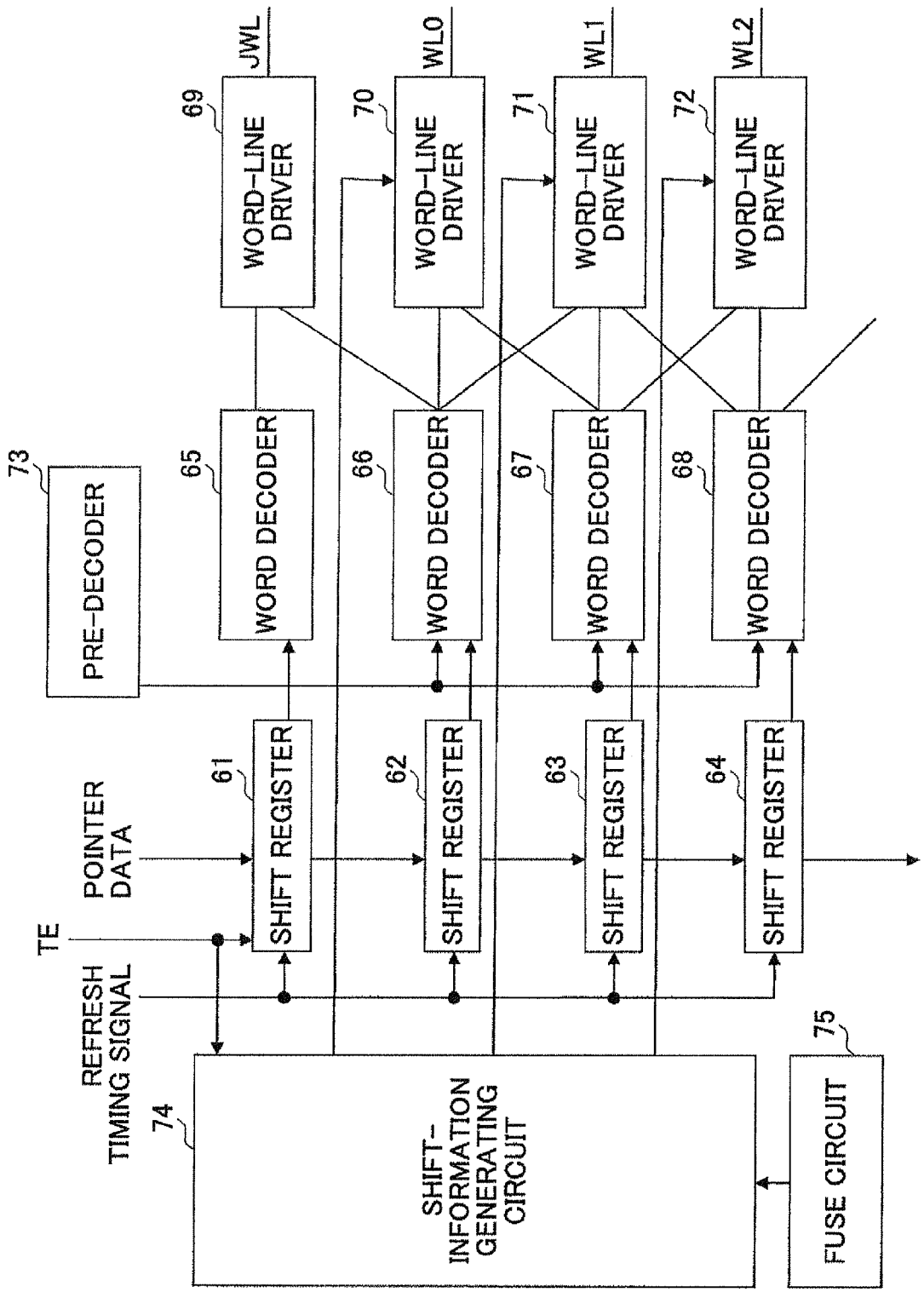
FIG. 6 is a drawing illustrating an example of the configuration of a shift-control and word decoder.

FIG. 6 is a drawing illustrating an example of the configuration of the shift-control and word decoder 27. The shift-control and word decoder 27 of FIG. 6 includes shift registers 61 through 64, word decoders 65 through 68, word-line drivers 69 through 72, a pre-decoder 73, a shift-information generating circuit 74, and a fuse circuit 75. FIG. 6 illustrates an example in which the number of primary word lines is 3, and the number of redundant word lines is 1. The numbers of word lines are not limited to this configuration.

In the following, a description will be first given of the case in which the test signal TE is asserted. The shift registers 61 through 64 are provided in one-to-one correspondence to plural primary word lines WL0 through WL2 and a redundant word line JWL. The shift registers 61 through 64 are configured such that data indicative of a word line subjected to a refresh operation propagates through successive shifting actions. Namely, the shift registers 61 through 64 performs a shift operation in synchronization with each pulse of the refresh timing signal that is part of the core control signals supplied from the refresh address counter 15 (see FIG. 5), so that pointer data propagates through the shift registers 61 through 64 one after another. Each of the shift registers 61 through 64 may be a one-bit flip-flop, and the pointer data may be one-bit data "1". One of the shift registers 61 through 64 that stores this pointer data indicates a word line that is subjected to a refresh operation. Namely, the redundant word line JWL is refreshed when the pointer data is stored in the shift register 61. The primary word line WL0 is refreshed when the pointer data is stored in the shift register 62. The primary word line WL1 is refreshed when the pointer data is stored in the shift register 63. The primary word line WL2 is refreshed when the pointer data is stored in the shift register 64. In this manner, the pointer data is successively stored in and propagates through all the shift registers 61 through 64 when the test signal TE is in an asserted state to refresh all the primary word lines and all the redundancy word lines.

With the test signal TE being in a negated state, only the word lines that are actually used are refreshed. That is, the pointer data is successively stored in and propagates through only the shift registers 62 through 64 corresponding to the primary word lines among the shift registers 61 through 64. Provision may be made such that, upon receiving the pointer data, the shift register 61 allows the pointer data to pass through to appear at its output.

Namely, the shift register 61 operates as a normal shift register to load and store the received pointer data in response to the refresh timing signal when the test signal TE supplied from the test mode setting circuit 13 (see FIG. 5) is in an asserted state. The shift register 61 connects its input end directly to its output end to allow the pointer data received at the input end to appear directly at the output end when the test signal TE is in a negated state.

As illustrated in FIG. 6, the word-line drivers 69 through 72 are provided in one-to-one correspondence to the plural primary word lines WL0 through WL2 and the redundant word line JWL, and the word decoders 65 through 68 are further provided. The fuse circuit 75 records a defective word line address as a redundancy address (i.e., the address to which a redundancy operation is applied). The shift-information generating circuit 74 assigns the word decoders 65 through 68 to the word-line drivers 69 through 72 while avoiding the word-line driver that corresponds to a defective word line among the primary word lines (i.e., word line address recorded in the fuse circuit 75). The word line WL1 may be defective, for example. In such a case, the word-line driver 69 is activated when the word decoder 66 is selected. The word-line driver 70 is activated when the word decoder 67 is selected. The word-line driver 72 is activated when the word decoder 68 is selected. In this manner, access operations with respect to memory cells are performed by use of the redundant word line JWL, the primary word line WL0, and the primary word line WL2.

Figure 7:
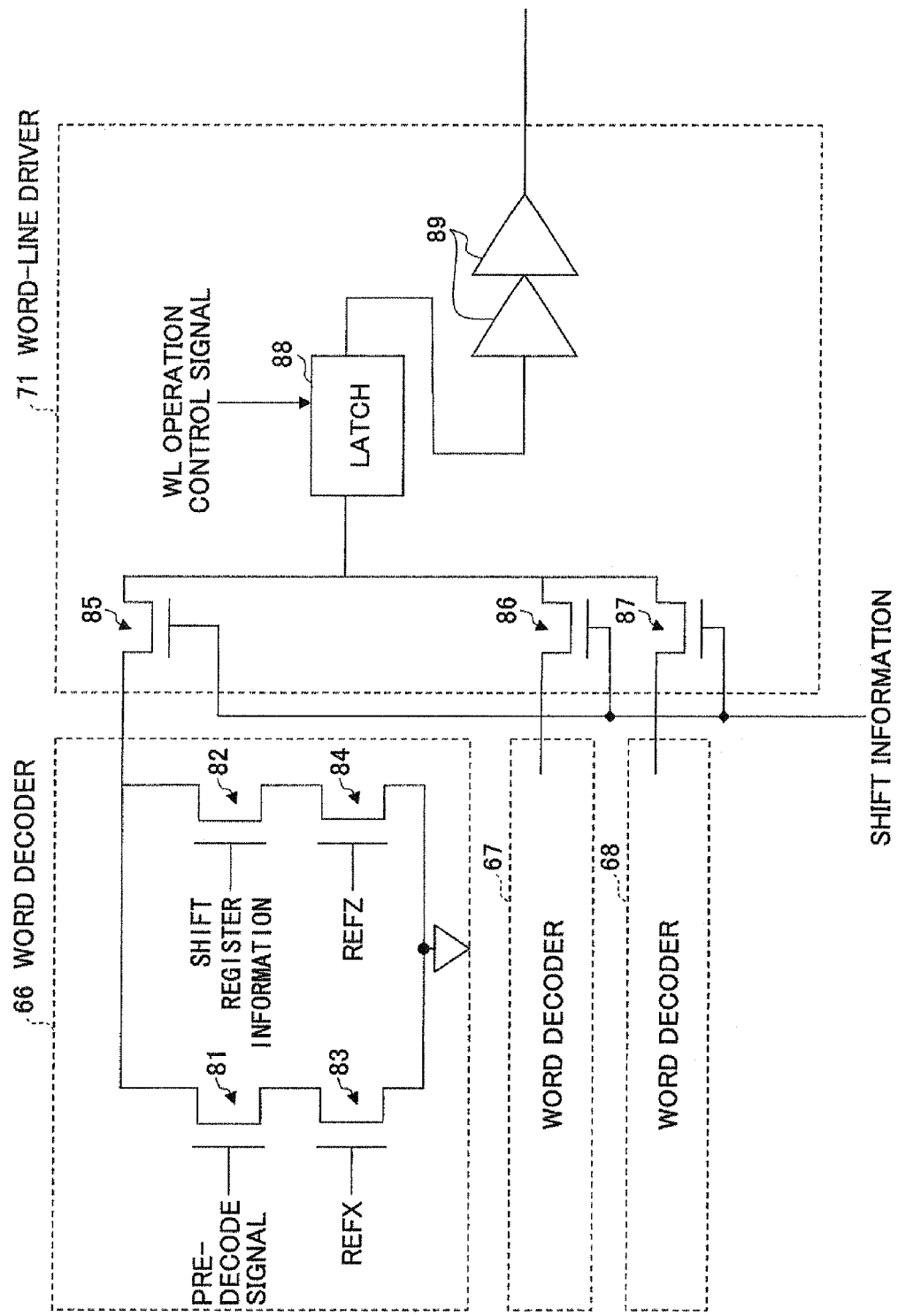
FIG. 7 is a drawing illustrating the relationships between plural word decoders and a word line driver.

FIG. 7 is a drawing illustrating the relationships between plural word decoders and a word line driver. FIG. 7 illustrates a configuration in which the word-line driver 71 is connected to the word decoders 66 through 68. The word decoders 66 through 68 have an identical configuration, and the configuration of the word decoder 66 is illustrated as a representative. The word decoder 66 includes transistors 81 through 84. REFZ and REFX are set to HIGH and LOW, respectively, at the time of a refresh operation. REFZ and REFX are set to LOW and HIGH, respectively, at other times other than the refresh operation. As a result, the output of the word decoder 66 is LOW at the time of a refresh operation when the corresponding shift-register output (i.e., shift-register information) is HIGH. At other times other than the time of a refresh operation, the output of the word decoder 66 is LOW when the pre-decode signal from the pre-decoder 73 is HIGH.

The word-line driver 71 includes transistors 85 through 87, a latch 88, and a driver circuit 89. The gates of the transistors 85 through 87 receive shift information from the shift-information generating circuit 74. When the word-line driver 71 is to be activated by selecting the word decoder 67, the shift information is controlled to make the transistor 86 conductive. When the word-line driver 71 is to be activated by selecting the word decoder 66, the shift information is controlled to make the transistor 85 conductive. When the word-line driver 71 is to be activated by selecting the word decoder 68, the shift information is controlled to make the transistor 87 conductive. The transistors other than the transistor that is selectively made to be conductive are placed in a nonconductive state.

The output of the word decoder selected by the transistor that is conductive among the transistors 85 through 87 may be LOW, which is stored in the latch 88. The fact that the latch 88 stores LOW indicates that the word-line driver 71 is activated, so that the driver circuit 89 activates a corresponding word line.

The basic configuration of the word-line driver 71 described above is employed in each of the word-line drivers 69 through 72. However, the number of selection-purpose transistors (i.e., transistors 85 through 87 in FIG. 7) is not limited to three. In the case of the word-line driver 70, for example, the number of selection-purpose transistors is two. One of the selection-purpose transistors is selectively made to be conductive in each of the word-line drivers 69 through 72 in response to the shift information supplied from the shift-information generating circuit 74. With this arrangement, the word decoders 65 through 68 are assigned to the word-line drivers 69 through 72 while avoiding the word-line driver corresponding to a defective word line found among the primary word lines.

Figure 8:
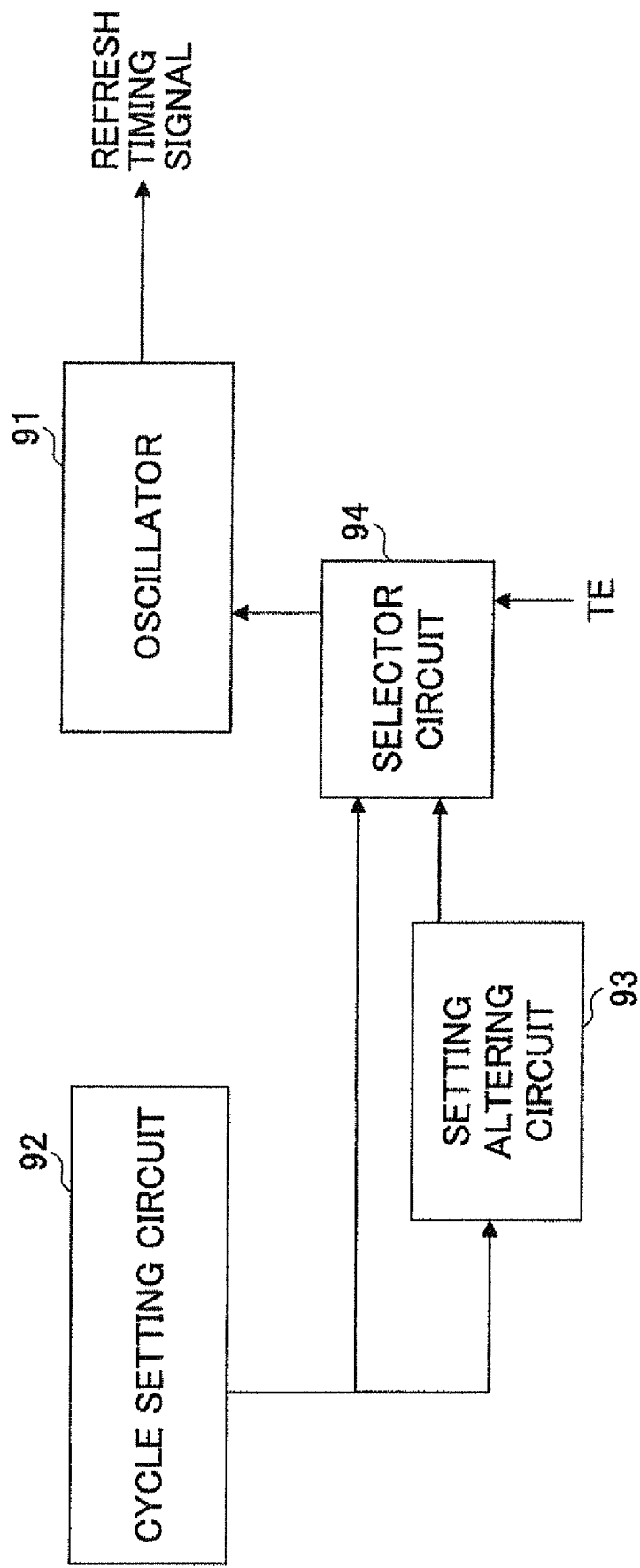
FIG. 8 is a drawing illustrating an example of the configuration of a timing signal generating circuit.

FIG. 8 is a drawing illustrating an example of the configuration of the oscillator 19. The oscillator 19 is used in the semiconductor memory device of FIG. 1 or FIG. 5. The oscillator 19 illustrated in FIG. 8 includes an oscillator 91, a cycle setting circuit 92, a setting altering circuit 93, and a selector circuit 94.

As previously described, the semiconductor memory device of FIG. 1 or FIG. 5 is configured to be switchable between a first mode and a second mode to successively select, in the first mode, word lines one by one that are equal in number to the primary word lines, and to successively select, in the second mode, all the primary word lines and all the redundant word lines one by one. Switching is controlled by the test signal TE supplied from the test mode setting circuit 13. In general, the cycle of refresh operations is set to be longer by a margin of safety than the refresh time cycle that is the minimum necessary to retain each memory cell data. A given constant pulse interval of the refresh timing signal may suffice to retain correct data through refresh operations in the first mode described above. However, such a constant pulse interval may not be sufficient to retain correct data in the second mode because the number of word lines to be refreshed is increased to prolong the refresh interval of each memory cell.

In the configuration illustrated in FIG. 8, provision is made to alter the oscillating frequency that forms a basis for the refresh timing signal output from the oscillator 19 in response to the test signal TE supplied from the test mode setting circuit 13. The cycle setting circuit 92 may be a fuse circuit or latch circuit, and stores therein information indicative of an oscillating frequency of the oscillator 91. The information indicative of the oscillating frequency stored in the cycle setting circuit 92 is supplied directly to the selector circuit 94 through a first path, and is also supplied to the selector circuit 94 through a second path via the setting altering circuit 93 after its information content is altered. The setting altering circuit 93 may be a subtraction circuit. The setting altering circuit 93 shortens the oscillating cycle indicated by the received information, and outputs the altered information indicative of the shortened oscillating cycle.

The selector circuit 94 supplies to the oscillator 91 the cycle information directly supplied from the cycle setting circuit 92 when the test signal TE supplied from the test mode setting circuit 13 is in a negated state. In the case of the test signal TE being in a negated state, thus, the cycle of the oscillating signal that forms a basis for the refresh timing signal generated by the oscillator 91 becomes equal to the cycle that is set in the cycle setting circuit 92.

The selector circuit 94 supplies to the oscillator 91 the cycle information indicative of the shortened cycle supplied from the cycle setting circuit 92 via the setting altering circuit 93 when the test signal TE supplied from the test mode setting circuit 13 is in an asserted state. In the case of the test signal TE being in an asserted state, thus, the cycle of the oscillating signal that forms a basis for the refresh timing signal generated by the oscillator 91 becomes shorter than the cycle that is set in the cycle setting circuit 92. Namely, the pulse intervals of the refresh timing signal become shorter than the pulse intervals used in the case of the test signal TE being in a negated state. With this arrangement, proper data retention is achieved at each memory cell even when all the primary word lines and redundant word lines are successively selected and refreshed one by one.

Figure 9:
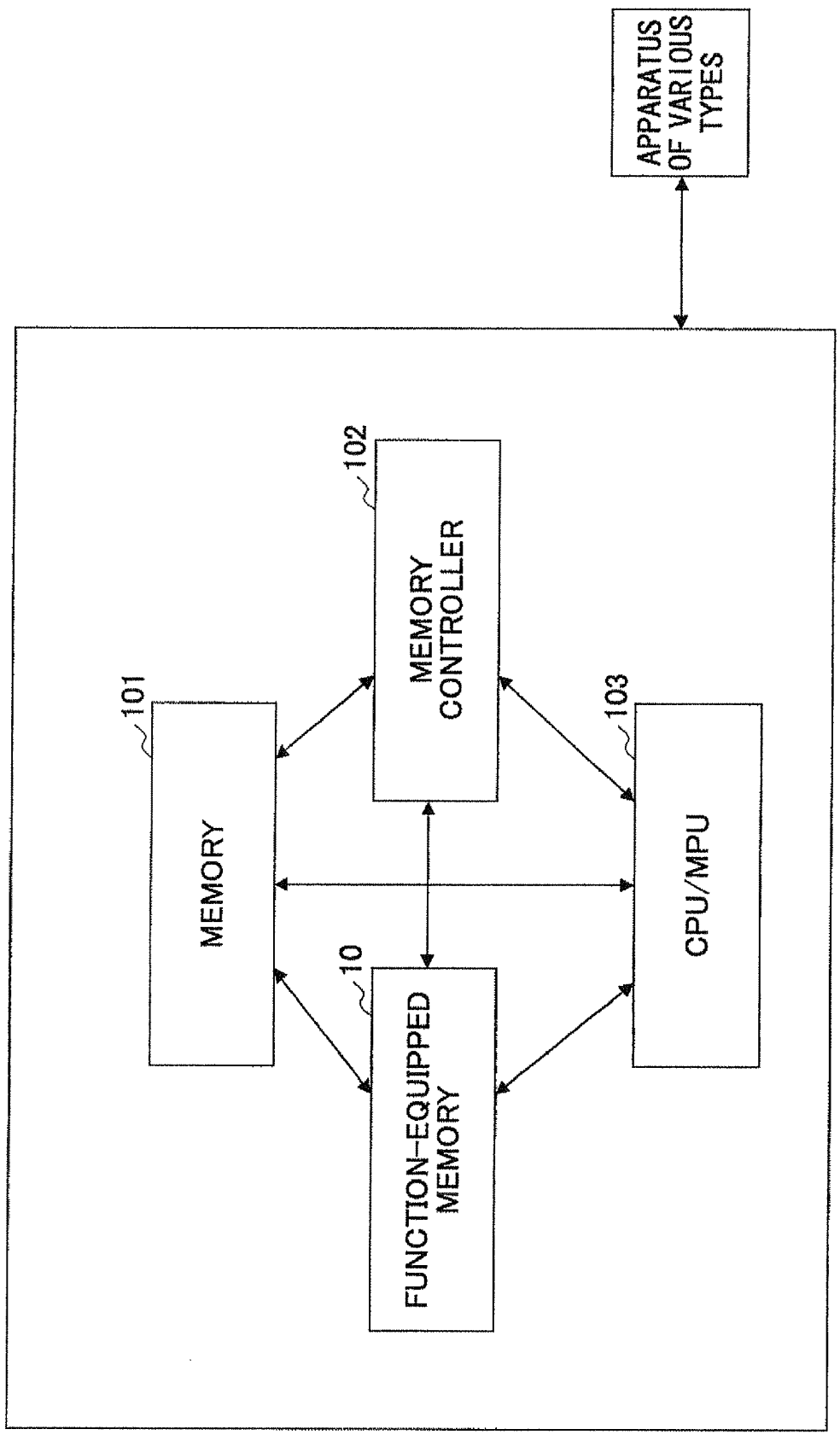
FIG. 9 is a drawing illustrating an example of the configuration of a system.

FIG. 9 is a drawing illustrating an example of the configuration of a system. A system illustrated in FIG. 9 includes the semiconductor memory device (function-equipped memory) 10 (or 10A) of FIG. 1 or FIG. 5, a memory 101, a memory controller 102, and a CPU or MPU 103. In the operation test of the semiconductor memory device 10 (or 10A), either a first mode to successively select and refresh word lines one by one that are equal in number to the primary word lines or a second mode to successively select and refresh all the primary word lines and all the redundant word lines one by one is selected according to need in response to a mode register setting made by the CPU 103 to the semiconductor memory device 10 (or 10A).

Figure 10:
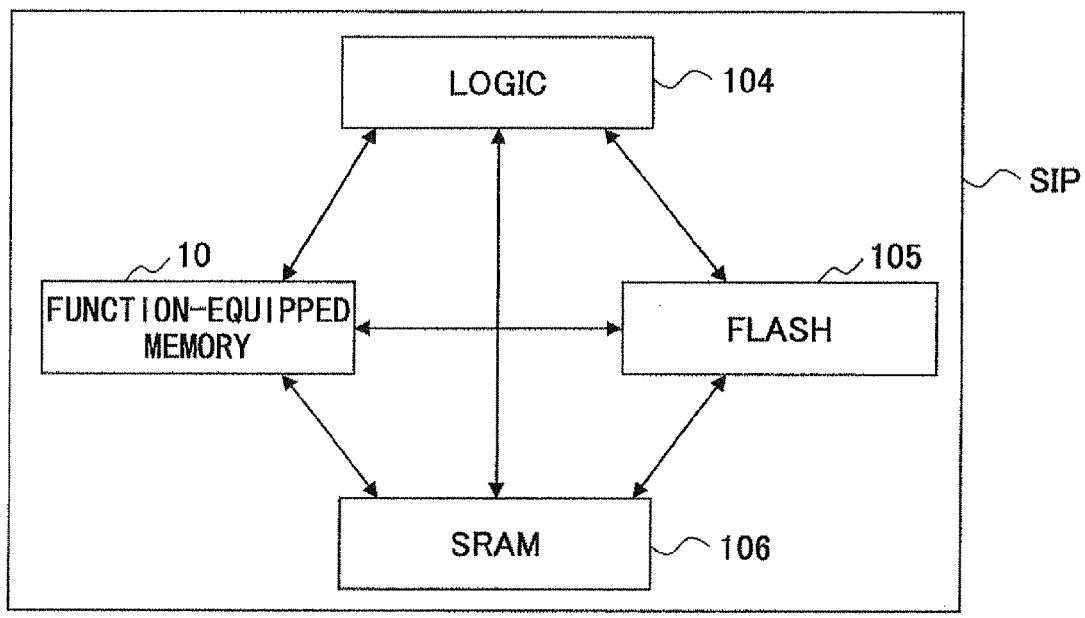
FIG. 10 is a drawing illustrating an example of the configuration of the system that is implemented as an SIP.
Figure 11:
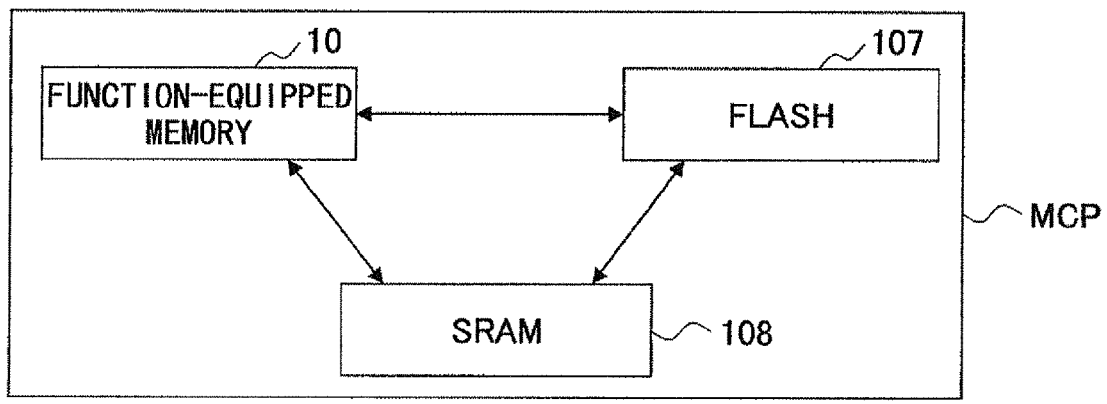
FIG. 11 is a drawing illustrating an example of the configuration of the system that is implemented as an MCP.

FIG. 10 is a drawing illustrating an example of the configuration of the system that is implemented as an SIP. The SIP (System In Package) illustrated in FIG. 10 includes the semiconductor memory device (function-equipped memory) 10 (or 10A), a logic circuit 104, a flash memory 105, and an, SRAM 106. FIG. 11 is a drawing illustrating an example of the configuration of the system that is implemented as an MCP. The MCP (Multi Chip Package) illustrated in FIG. 11 includes the semiconductor memory device (function-equipped memory) 10 (or 10A), a flash memory 107, and an SRAM 108. The semiconductor memory device 10 (or 10A) according to the embodiments may be utilized in various types of implementations as noted above.

According to at least one embodiment, a refresh operation is performed by successively selecting all the primary word lines and all the redundant word lines one by one. Because of this, both the redundant word lines and the primary word lines are properly tested when an operation test is conducted while performing refresh operations initiated by an internal refresh mechanism.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor memory device, comprising:
a memory cell array including primary word lines and one or more redundant word lines;
a timing signal generating circuit configured to generate a refresh timing signal comprised of a series of pulses arranged at constant intervals; and
a refresh-target selecting circuit configured to successively select all the primary word lines and all the one or more redundant word lines one by one in response to the respective pulses of the refresh timing signal,
wherein a refresh operation is performed with respect to the word lines that are successively selected by the refresh-target selecting circuit,
wherein the refresh-target selecting circuit is configured to be switchable between a first mode and a second mode to successively select, in the first mode, word lines one by one that are equal in number to the primary word lines, and to successively select, in the second mode, all the primary word lines and all the one or more redundant word lines one by one.

2. The semiconductor memory device as claimed in claim 1, further comprising a redundancy control circuit configured to select either a redundant word line or a primary word line corresponding to an access address depending on match or mismatch between the access address and a validly preset redundancy address if the redundancy address is validly preset in case of a forced redundancy indicating signal being in a negated state, to select a primary word line corresponding to the access address if a redundancy address is not validly preset in case of the forced redundancy indicating signal being in the negated state, and to select a redundancy word line or primary word line corresponding to the access address in case of the forced redundancy indicating signal being in an asserted state, wherein the refresh-target selecting circuit is a refresh address generating circuit to generate a word line address to be refreshed, and is configured to perform a first operation that successively generates word line addresses while maintaining the forced redundancy indicating signal in the negated state and a second operation that successively generates word line addresses while maintaining the forced redundancy indicating signal in the asserted state.

3. The semiconductor memory device as claimed in claim 2, wherein the refresh-target selecting circuit is configured to perform only the first operation in the first mode and to perform the first operation and thereafter the second operation in succession in the second mode.

4. The semiconductor memory device as claimed in claim 2, wherein the refresh-target selecting circuit includes:
   a first counter circuit activated in the first operation to generate word-line addresses equal in number to the number of the primary word lines;
   a second counter circuit activated in the second operation to generate word-line addresses equal in number to the number of the redundant word lines; and
   a switch circuit to control the forced redundancy indicating signal and selectively activate the first counter and the second counter.

5. The semiconductor memory device as claimed in claim 2, wherein the refresh-target selecting circuit includes:
   a counter to generate word line addresses; and
   a switch circuit to control the forced redundancy indicating signal, to cause the counter to generate word-line addresses equal in number to the number of the primary word lines in the first operation, and to cause the counter to generate word-line addresses equal in number to the number of the redundant word lines in the second operation.

6. The semiconductor memory device as claimed in claim 1, wherein the refresh-target selecting circuit includes a plurality of shift registers provided in one-to-one correspondence to the primary word lines and one or more redundant word lines to cause data indicative of a word line subjected to a refresh operation to propagate through successive shifting actions, and is configured to cause the data to propagate successively through all the shift registers in the first mode and to cause the data to propagate successively through only those of the shift registers corresponding to actually used word lines.

7. The semiconductor memory device as claimed in claim 6, further comprising:
   a plurality of word line drivers provided in one-to-one correspondence to the primary word lines and one or more redundant word lines;
   a plurality of word line decoders; and
   a shift-information generating circuit to assign the word line decoders to the word line drivers while avoiding one or more of the word line drivers corresponding to defective word lines among the primary word lines.

8. The semiconductor memory device as claimed in claim 1, further comprising a control circuit to control pulse intervals of the refresh timing signal generated by the timing signal generating circuit, wherein the control circuit is configured to set the pulse intervals to a first interval in the first mode and set the pulse intervals to a second interval shorter than the first interval in the second mode.

9. A system, comprising:
   a CPU; and
   a memory,
   wherein the memory includes:
   a memory cell array including primary word lines and one or more redundant word lines;
   a timing signal generating circuit configured to generate a refresh timing signal comprised of a series of pulses arranged at constant intervals; and
   a refresh-target selecting circuit configured to successively select all the primary word lines and all the one or more redundant word lines one by one in response to the respective pulses of the refresh timing signal,
   wherein the memory is configured to perform a refresh operation with respect to the word lines that are successively selected by the refresh-target selecting circuit,
   wherein the refresh-target selecting circuit is configured to be switchable between a first mode and a second mode to successively select, in the first mode, word lines one by one that are equal in number to the primary word lines, and to successively select, in the second mode, all the primary word lines and all the one or more redundant word lines one by one.

10. The semiconductor memory device as claimed in claim 9, further comprising a redundancy control circuit configured to select either a redundant word line or a primary word line corresponding to an access address depending on match or mismatch between the access address and a validly preset redundancy address if the redundancy address is validly preset in case of a forced redundancy indicating signal being in a negated state, to select a primary word line corresponding to the access address if a redundancy address is not validly preset in case of the forced redundancy indicating signal being in the negated state, and to select a redundancy word line or primary word line corresponding to the access address in case of the forced redundancy indicating signal being in an asserted state, wherein the refresh-target selecting circuit is a refresh address generating circuit to generate a word line address to be refreshed, and is configured to perform a first operation that successively generates word line addresses while maintaining the forced redundancy indicating signal in the negated state and a second operation that successively generates word line addresses while maintaining the forced redundancy indicating signal in the asserted state.

11. The semiconductor memory device as claimed in claim 10, wherein the refresh-target selecting circuit is configured to perform only the first operation in the first mode and to perform the first operation and thereafter the second operation in succession in the second mode.

12. The semiconductor memory device as claimed in claim 10, wherein the refresh-target selecting circuit includes:
   a first counter circuit activated in the first operation to generate word-line addresses equal in number to the number of the primary word lines;
   a second counter circuit activated in the second operation to generate word-line addresses equal in number to the number of the redundant word lines; and
   a switch circuit to control the forced redundancy indicating signal and selectively activate the first counter and the second counter.

13. The semiconductor memory device as claimed in claim 10, wherein the refresh-target selecting circuit includes:
   a counter to generate word line addresses; and
   a switch circuit to control the forced redundancy indicating signal, to cause the counter to generate word-line addresses equal in number to the number of the primary word lines in the first operation, and to cause the counter to generate word-line addresses equal in number to the number of the redundant word lines in the second operation.

14. The semiconductor memory device as claimed in claim 9, wherein the refresh-target selecting circuit includes a plurality of shift registers provided in one-to-one correspondence to the primary word lines and one or more redundant word lines to cause data indicative of a word line subjected to a refresh operation to propagate through successive shifting actions, and is configured to cause the data to propagate successively through all the shift registers in the first mode and to cause the data to propagate successively through only those of the shift registers corresponding to actually used word lines.

15. The semiconductor memory device as claimed in claim 14, further comprising:

a plurality of word line drivers provided in one-to-one correspondence to the primary word lines and one or more redundant word lines;

a plurality of word line decoders; and a shift-information generating circuit to assign the word line decoders to the word line drivers while avoiding one or more of the word line drivers corresponding to defective word lines among the primary word lines.

16. The semiconductor memory device as claimed in claim 9, further comprising a control circuit to control pulse intervals of the refresh timing signal generated by the timing signal generating circuit, wherein the control circuit is configured to set the pulse intervals to a first interval in the first mode and set the pulse intervals to a second interval shorter than the first interval in the second mode.

* * * * *